US012607500B2

(12) United States Patent
Du et al.

(10) Patent No.: US 12,607,500 B2
(45) Date of Patent: Apr. 21, 2026

(54) WATERPROOF SOUND AND VIBRATION SENSING DEVICE

(71) Applicant: Harman International Industries, Incorporated, Stamford, CT (US)

(72) Inventors: Yu Du, Chicago, IL (US); Pablo Diego Regla, Budapest (HU); Péter Tamás Podlócz, Budapest (HU); Daniel Hajdu, Budapest (HU)

(73) Assignee: Harman International Industries, Incorporated, Stamford, CT (US)

( * ) Notice: Subject to any disclaimer, the term of this patent is extended or adjusted under 35 U.S.C. 154(b) by 307 days.

(21) Appl. No.: 18/478,258

(22) Filed: Sep. 29, 2023

(65) Prior Publication Data

US 2025/0109982 A1 Apr. 3, 2025

(51) Int. Cl.
*G01H 11/08* (2006.01)
*B81B 3/00* (2006.01)
*G01H 3/00* (2006.01)

(52) U.S. Cl.
CPC ........... *G01H 11/08* (2013.01); *B81B 3/0021* (2013.01); *G01H 3/005* (2013.01); *B81B 2201/0257* (2013.01)

(58) Field of Classification Search
CPC .................. G01H 11/08; B81B 3/0021; B81B 2201/0257; H04R 1/04; H04R 1/086; H04R 2499/13; H04R 1/083

USPC .......................................................... 73/645
See application file for complete search history.

(56) References Cited

U.S. PATENT DOCUMENTS

| | | | |
|---|---|---|---|
| 2011/0026757 A1 | 2/2011 | Takahashi et al. | |
| 2011/0064238 A1 | 3/2011 | Haas | |
| 2017/0111721 A1 | 4/2017 | Miehl et al. | |
| 2018/0362332 A1* | 12/2018 | Khenkin | ............... B81B 7/0058 |
| 2022/0321985 A1 | 10/2022 | Muraoka et al. | |

FOREIGN PATENT DOCUMENTS

| | | | |
|---|---|---|---|
| CN | 209314103 U | 8/2019 | |
| CN | 115002630 A * | 9/2022 | ............... H04R 7/04 |
| CN | 116033310 A | 4/2023 | |

* cited by examiner

*Primary Examiner* — Peter J Macchiarolo
*Assistant Examiner* — John M Royston
(74) *Attorney, Agent, or Firm* — Angela M. Brunetti

(57) ABSTRACT

A sound and vibration sensing device comprising a housing, a printed circuit board assembly (PCBA) including a sensor element supported inside the housing. A flexible and non-porous structural membrane is arranged to seal the housing at one end creating a first closed air volume below the sensor element and a second closed air volume above the sensor element wherein the sensor element measures changes in air pressure in the first closed air volume caused by vibration of the structural membrane induced by external acoustic pressure and structural vibration to output a combined sound and vibration signal.

23 Claims, 8 Drawing Sheets

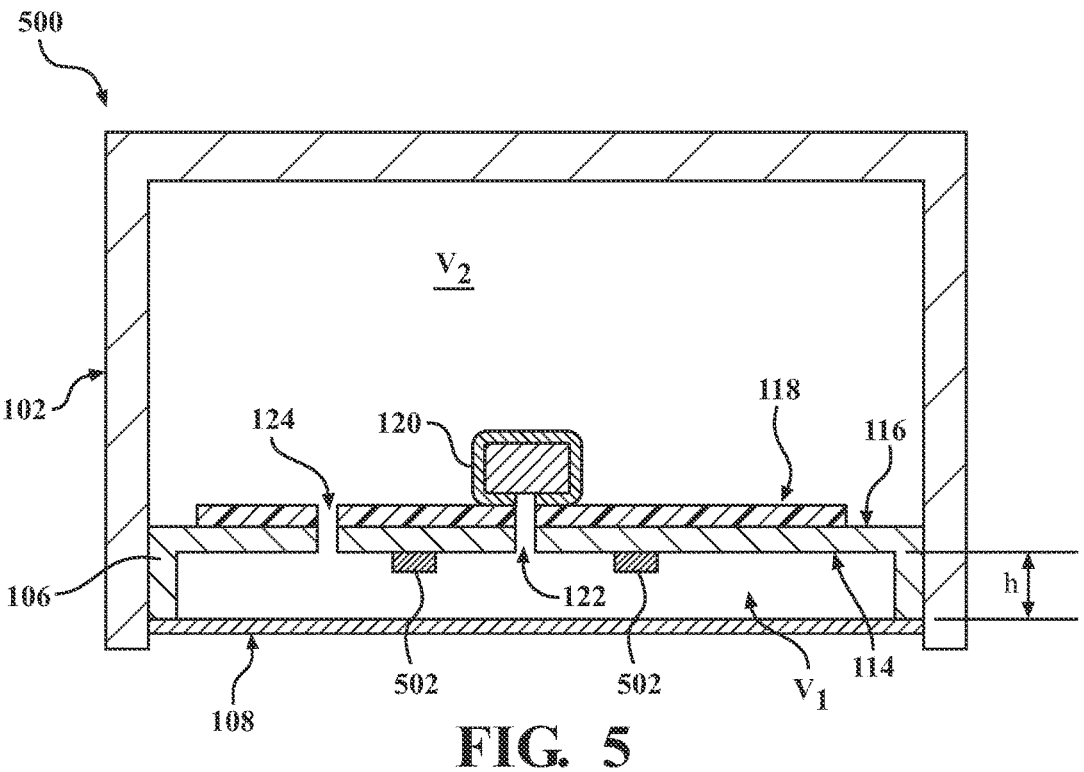
FIG. 5
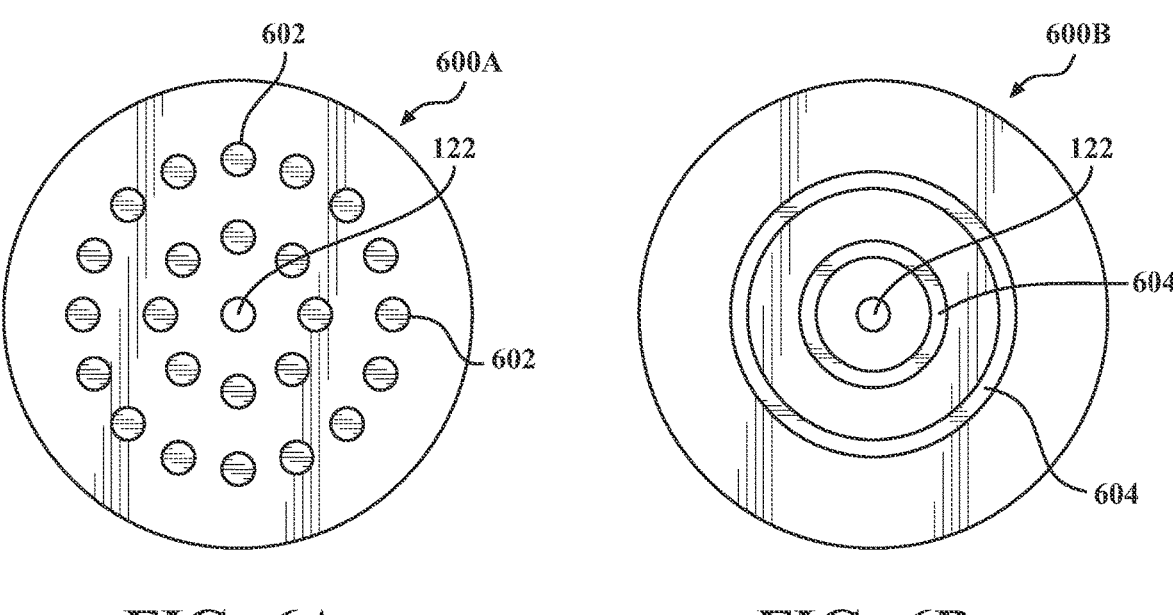
FIG. 6A             FIG. 6B

WATERPROOF SOUND AND VIBRATION SENSING DEVICE

TECHNICAL FIELD

The present disclosure relates to a sound and vibration sensing device and more particularly, to a waterproof sound and vibration sensing device.

BACKGROUND OF THE INVENTION

With the growth of driving assistance technologies and autonomous driving vehicles, the number of sensors on a vehicle has grown extensively. As a result of the development of these technologies, it has become necessary to sense sound and vibrations from outside the vehicle. Therefore, sensing devices are being positioned on an exterior surface structure (e.g., body panel, frame, glass) of the vehicle that is directly exposed to various types of harsh environmental conditions. Thus, the sensing devices must withstand usage of the vehicle in many scenarios, including but not limited to, exposure to water and moisture, high-temperature/high-pressure water jet, ice, dust, debris, and mud.

For robust performance, it is desirable to achieve the highest environmental protection levels for the sensing devices. This includes, for example, water and dust ingress and close-range high temperature, high pressure spray (up to 85° C. and 10 MPa) as described by the IP6K9K rating in ISO 20653. To achieve such a high-level environmental protection for sound sensing microphones that expose the sensing element directly to the external acoustic environment through an aperture, a logical approach is to enclose the microphone element inside a housing to physically separate the delicate sensing element from contaminants in the environment. However, such physical separation inevitably modifies the sound transmission path which, if not carefully designed, alters, or degrades the acoustic performance.

SUMMARY OF THE INVENTION

A sound and vibration sensing device having a housing, a support structure in the housing, a flexible, non-porous structural membrane that is arranged to seal the housing thereby creating a first closed air volume between a second surface of the structural membrane and a first surface of the support structure and a second closed air volume between the housing and a second surface of the support structure. Aa sensor element arranged on a printed circuit board assembly (PCBA) attached to the second surface of the support structure measures changes of air pressure in the first closed air volume caused by vibration of the structural membrane induced by external acoustic pressure and structural vibration input, and the sound and vibration sensing device outputs a combined sound and vibration signal output.

In one or more embodiments, the sound and vibration sensing device has a leak channel between the first and second closed air volumes to filter a low frequency vibration signal.

In one or more embodiments, the size of the leak channel is dependent upon a predetermined frequency response shape, an attenuation amount, and a predetermined frequency range.

In one or more embodiments, the support structure has a mechanical stop on a surface of the support structure that faces into the first closed air volume.

In one or more embodiments, the support structure is cone-shaped.

In one or more embodiments, a damping layer is included. The damping layer may be positioned on first or second surfaces of the structural membrane.

In one or more embodiments, the housing has a vent from the second closed air volume. The vent may be covered by an acoustic mesh.

In one or more embodiments, the sound and vibration sensing device includes a second sensor element for simultaneously sensing sound and vibration.

In one or more embodiments, a sound and vibration sensing device has a housing, a printed circuit board assembly (PCBA) supported inside the housing including a sensor element.

A flexible, non-porous structural membrane is arranged to seal the housing at one end defining a first closed air volume below the sensor element and a second closed air volume above the sensor element, wherein the sensor element measures changes in air pressure in the first closed air volume caused by vibration of the structural membrane induced by external acoustic pressure and structural vibration to output a combined sound and vibration signal.

In one or more embodiments, a leak channel in the PCBA connects the first and second closed air volumes to filter a low frequency vibration signal.

In one or more embodiments, the structural membrane has a footing member that attaches to a bottom surface of the housing and also supports the PCBA inside the housing.

BRIEF DESCRIPTION OF DRAWINGS

The features, objects, and advantages of the present disclosure will become more apparent from the detailed description hereinafter when taken in conjunction with the drawings, in which like reference numbers refer to like elements.

FIG. 2 is a is a lumped-parameter model representing vibrations of a structural membrane;

FIG. 5 is a schematic of a sensing device according to one or more embodiments;

FIG. 6A is a bottom view of the support structure showing one or more embodiments of a mechanical stop;

FIG. 6B is a bottom view of the support structure showing one or more embodiments of a mechanical stop;

DETAILED DESCRIPTION OF THE INVENTION

Figure 1:
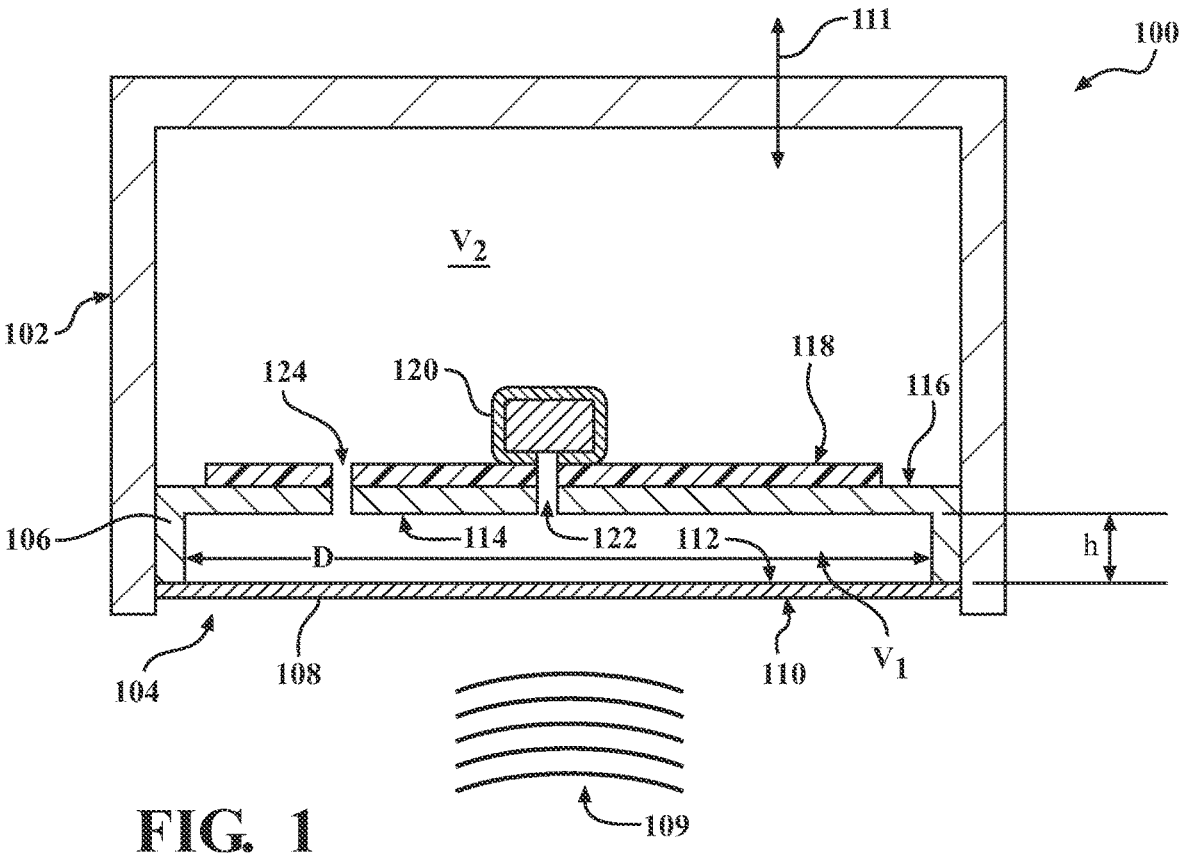
FIG. 1 is a schematic of a sensing device according to one or more embodiments.

FIG. 1 is a schematic of a sound and vibration sensing device 100 according to one or more embodiments. A housing 102 has an opening 104 at one end. A support structure 106 is attached in a sealed manner inside the housing 102 at the opening 104. A structural membrane 108 is attached in a sealed manner to the support structure 106 and/or the housing 102 in such a way that there are no openings to the environment external to the housing 102. In practical applications, the housing 102 of the sound and vibration sensing device 100 may be mounted and mechanically fixed to a base structure, not shown in FIG. 1, which may be, for example, a body panel, vehicle frame, glass surface of a vehicle.

A first surface 110 of the structural membrane 108 is exposed to an outside environment, external to the housing 102. A second surface 112 of the structural membrane 108 is internal to the housing 102. The sealed manner of attachment among the housing 102, the support structure 106, and the structural membrane 108 defines a first closed air volume, V1, inside the housing 102 between the second surface 112 of the structural membrane 108 and a first surface 114 of the support structure 106. The use of "closed" in relation to the first closed air volume refers to V1 being closed-off from the environment external to the housing 102.

Acoustic pressure 109 acting on the first surface 110 of the structural membrane 108 causes the structural membrane 108 to flex, which changes the volume of the first closed air volume, V1 and results in a dynamic (or acoustic) pressure inside the first closed air volume, V1. A second closed air volume, V2 is defined between the housing 102 and a second surface 116 of the support structure 106. The use of "closed" in relation to the second closed air volume, V2, also refers to V2 being closed-off from the environment external to the housing 102. Vibration (e.g., acceleration) input 111 is transmitted via the support structure 106. As described above, the sound and vibration sensing device 100 may attach to the base structure by way of the housing 102. Structural vibration (e.g., acceleration) input 111 from the base structure may also be transmitted to the support structure 106 by way of the housing 102, causing the structural membrane 108 to flex.

A printed circuit board (PCB) 118 is mounted to the second surface 116 of the support structure 106. A sensor element 120 is placed on the PCB 118. The sensor element 120 may be, for example, a microphone device such as a micro-electro-mechanical system (MEMS) microphone device, or an electret condenser microphone (ECM) device. Other circuit components (not shown in FIG. 1) that are necessary for the sensor element 120 to function properly may also be placed on the PCB 118. The PCB 118, the sensor element 120, and any other necessary components on the PCB 118 are referred to as a PCB assembly (PCBA).

The first surface 110 of the structural membrane 108 is exposed to the outside environment. The housing 102 is sealed by the structural membrane 108. The structural membrane 108 and the support structure 106 define the closed air volume, V1. Materials and configurations of the seal created between the housing 102, the support structure 106, and the structural membrane 108 may vary based on design criteria so long as the attachment of elements creates a seal between the structural membrane 108 and the support structure 106 to define the first closed air volume V1 and to protect the sensor element 120 from contaminants.

An aperture, or port hole, 122 in the PCB 118 and the support structure 106 opens the first closed air volume, V1, to the sensor element 120. The sensor element (e.g., a MEMS microphone or ECM) measures pressure changes in V1 that are induced by the vibration motion of the structural membrane 108 that is the result of acoustic pressure 109 acting on the first surface 110 of the structural membrane 108. Alternatively, or additionally, the vibration motion of the structural membrane 108 may also be induced by the base structural vibration input 111. It should be noted that, in the case when a MEMS microphone device is used, the sensor element 120 may be either a bottom-port MEMS or a top-port MEMS microphone so long as the port hole 122 is open to the first closed air volume, V1.

The structural membrane 108 is not an acoustic membrane or mesh typically used to protect microphones from foreign contamination. The structural membrane 108 is a structurally durable membrane made of a solid material, for example, engineering plastic or metal. The structural membrane 108 is not only non-porous to liquids and dust, but also air.

FIG. 2 is a lumped-parameter model 200 that represents how the structural membrane 108 vibrates under external excitations. The structural membrane 108 is represented as a mass, $m_s$, supported on the support structure (not shown in FIG. 2) and/or the housing 102. A first spring, $k_s$, represents the structural spring stiffness of the structural membrane 108. A second, parallel spring, $k_a$, represents the air spring stiffness of the first closed air volume, V1. Structural damping of the structural membrane 108, is represented by parameter, $c_s$. When external acoustic waves strike the first surface 110 of the structural membrane 108, vibration (e.g., in the forms of displacement, velocity, and acceleration) is induced in a direction normal to the first surface of the structural membrane 108. Additionally, structural vibration input 111 may be transmitted to the support structure 106 (not shown in FIG. 2) through the housing 102 leading to vibration energy being transmitted directly to the structural membrane 108 that is attached to the support structure 106 and/or the housing 102.

A displacement amplitude, d, of the structural membrane 108 to unit input (i.e., displacement sensitivity), the input being acoustic pressure input 109 and/or support structure vibration input 111, may be controlled by a total stiffness, $(k_s + k_a)$. A measurement bandwidth of the sensor element 120 may be determined by a resonance frequency of this mass-spring vibration system and is proportional to a square root of the ratio of a total stiffness, $(k_s + k_a)$, to an effective mass of the structural membrane, $m_s$. Lastly, a peak displacement amplitude at the resonance frequency is mainly determined by the structural damping, $c_s$ of the structural membrane 108.

Displacement of the structural membrane 108 due to, for example, external acoustic input (a primary sound pressure) 109, causes changes in the closed air volume, V1, which in turn causes an acoustic pressure (a secondary sound pressure) inside V1. The sensor element 120 (e.g., a MEMS microphone or ECM) on the PCB 118 is directly exposed to the first air volume, V1, through the port hole 122, to measure the secondary sound pressure. For a small sealed, air cavity, such as V1, the acoustic pressure generated due to volume change in the air cavity is proportional to an area of the structural membrane and the membrane displacement, but inversely proportional to the closed air volume. The material of the structural membrane may be a thin sheet, or sheets, of plastic, polymer, or metal such as acrylonitrile butadiene styrene (ABS), polybutylene terephthalate (PBT), nylon, and/or aluminum, etc.

Figure 3:
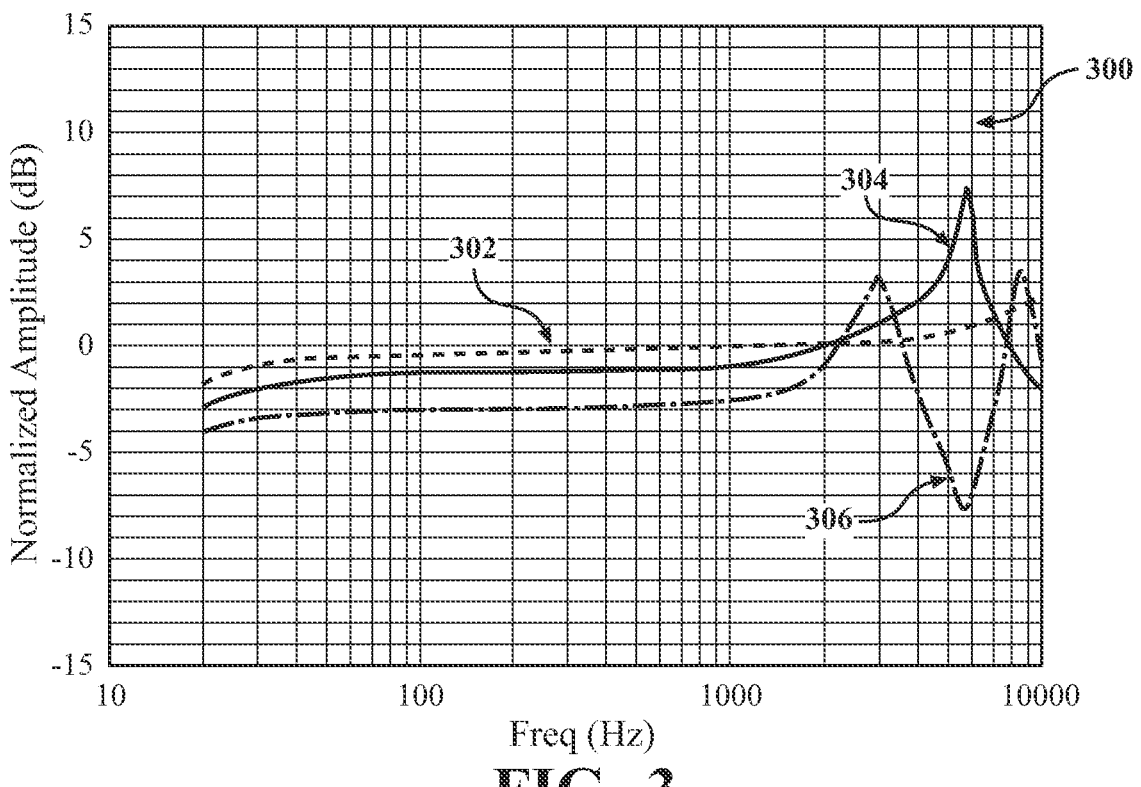
FIG. 3 is a measured frequency response of one or more embodiments of the sensing device.

FIG. 3 shows a measured frequency response 300 of one or more embodiments of the waterproof sound and vibration sensor shown in FIG. 1. Curve 302 is the response amplitude normalized to the 1 kHz sensitivity of a direct measurement of a MEMS microphone element without a structural membrane. Curve 304, in comparison, is a 0.1 mm thick aluminum structural membrane. Curve 306, in comparison, is a 0.4 mm thick plastic membrane. In each example, a height, h, and a diameter, D, (see FIG. 1) of the first closed air volume, V1, is 0.5 mm and 25 mm, respectively. This example design leads to a closed air volume, V1, of approximately 245 mm³.

As expected, the frequency response of curve 302, without a structural membrane, has the highest sensitivity and the widest effective measurement bandwidth of the sensor element, as represented by the flat portion of the curve 302. For a structural membrane made of aluminum, curve 304 shows that the sensitivity is reduced slightly (about 1 dB reduction at 1 kHz), and the bandwidth narrows to about 4 kHz. For a structural membrane made of plastic, the sensitivity is slightly more reduced (about 2.5 dB reduction at 1 kHz), and the bandwidth further narrows as well. The choice of material for the structural membrane will be dependent upon meeting targeted environmental protection requirements as well as the sensitivity and bandwidth requirements.

For example, for a structural membrane 108 and housing 102 having a circular shape, a range of the diameter for the structural membrane 108 may be between 10-35 mm. The thickness of the structural membrane may have a range, for example, between 0.2-0.8 mm for plastic or polymer materials and 0.02-0.2 mm for metallic materials.

The acoustic pressure generated in the closed air volume, V1, caused by the displacement of the structural membrane 108, is inversely proportional to V1. An effective way to increase sensitivity, and subsequently signal-to-noise ratio (SNR), is to minimize the volume of V1. Therefore, the height, h, of the first sealed air volume, V1, may be as small as practically allowable to minimize the enclosed air volume. An example range may be 0.1-1 mm.

The total mass of the structural membrane 108 may be, for example, two to three orders of magnitude higher than a membrane that is part of a MEMS microphone or ECM sensor element 120. It should be noted that the ranges described herein are for example purposes only. One skilled in the art is capable of understanding that a microphone sensitivity to vibration input transmitted from a base structure in the housing is proportional to the structural membrane mass, so that the waterproof sound and vibration sensor described herein, with a closed housing and a structural membrane, is more sensitive to a vibration input when compared to a traditional microphone element (e.g., MEMS microphone or ECM).

One skilled in the art is capable of understanding when both vibration (e.g., base acceleration) input and acoustic pressure input are of interest, the high vibration sensitivity of the one or more embodiments described herein is advantageous because the sensor effectively measures both and outputs a combined signal. On the other hand, sound-sensing microphone design often calls for minimizing vibration-sensing sensitivity. For example, in some practical automotive application scenarios, structural vibrations are located mostly at low frequencies (e.g., <300-500 Hz) while acoustic input is broadband up to 10 kHz or higher. Therefore, incorporating a high-pass filter will filter low frequency vibrations out of the sensor output signal. Since the acoustic pressure seen by the sensor element 120 is inversely proportional to the sealed volume directly in front of the sensor element 120, a larger effective volume at lower frequencies will reduce the sensitivity in the corresponding low frequency range where most vibration energy presents, for example, in a vehicle structure. A larger effective volume may be accomplished by including the second closed volume, V2 to be seen by the sensor element 120. Referring to FIG. 1, the first closed volume V1 and the second closed volume V2 may be connected by an optional leak channel 124.

Figure 4:
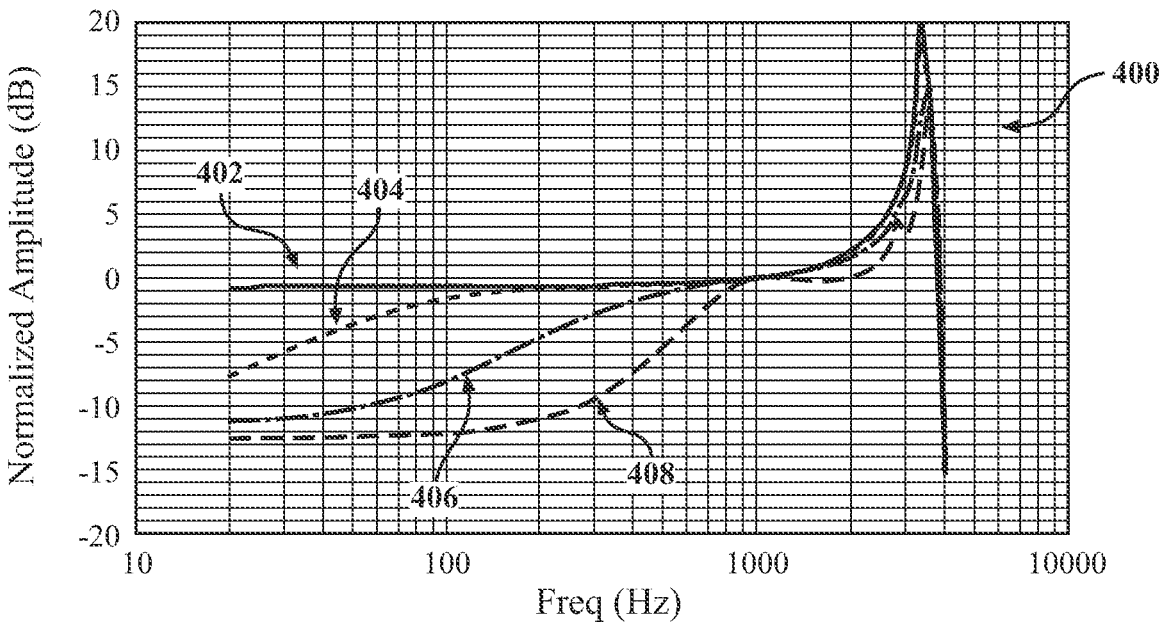
FIG. 4 is a simulated frequency response of one or more embodiments of the sensing device.

Low frequency sensitivity of the waterproof sound and vibration sensing device 100 may be attenuated by controlling the size of V2 in relation to V1. For example, when V2 is significantly larger (e.g., on the order of 10 times) than V1, low frequency sensitivity can be attenuated by approximately 7-12 dB as shown in FIG. 4, which shows simulated results of the frequency response amplitude normalized at 1 KHz.

Depending on a preferred frequency response shape, an attenuation amount, and a frequency range, within which the sensitivity is to be attenuated may be adjusted by adjusting a size of leak channel 124 which modifies the size of V2 in relation to V1. The curve 402 shows a frequency response for a leak channel having a 0.1 mm diameter. The curve 404 shows a frequency response for a leak channel having a diameter of 0.2 mm. The curve 406 shows a frequency response for a leak channel having a diameter of 0.3 mm. The curve 408 shows a frequency response for a leak channel having a diameter of 0.4 mm which shows how the low frequency sensitivity is attenuated by approximately 12 dB.

When the second closed volume V2 is connected to the first closed volume V1, sensitivity to vibration input is attenuated and sensitivity to acoustic input is attenuated. This may be desirable in some applications when an acoustic input above 300-500 Hz is the desired signal to be measured with an environmentally sealed sound and vibration sensor. In such applications, low frequency signals that contain the most vibration energy may be sensed by a separate, dedicated, vibration sensing element, such as an accelerometer.

A displacement amplitude of the structural membrane 108 may be induced by dynamic base vibration 111 and acoustic excitation 109 applied on the structural membrane 108, or external force directly applied to the first surface 110 of the structural membrane 108 (see FIG. 1). The resulting displacement amplitude corresponding to the dynamic base vibration or acoustic excitation may be on the order of tens to hundreds of micrometers, which is relatively small. However, under large external force inputs, such as the force that might be applied directly to the structural membrane surface under high pressure water spray, the resulting displacement (or deformation) amplitude could be much larger. Large displacement/deformation introduces stress on the material that may, undesirably, alter the mechanical properties of the structural membrane 108 or even cause damage rendering the sensor inoperable.

FIG. 5 shows one or more embodiments of a sound and vibration sensing device 500 that incorporates a mechanical stop 502 into the support structure 106 to prevent the structural membrane 108 from deforming excessively under large external force inputs. The mechanical stop 502 is located on the first surface 114 of the support structure 106. When the structural membrane 108 is exposed to an external force that causes a large displacement, the displacement/ deformation of the structural membrane 108 will be limited by the mechanical stop 502 thereby preventing it from being overstressed.

An additional advantage of the mechanical stop 502 may be realized by using a design, or pattern, of the mechanical stop 502 to help increase the sensitivity of the sound and vibration sensing device 500. The structure of the mechanical stop 502 may be implemented in a manner that consumes some of the closed volume V1. For example, FIG. 6A shows one example of many in which a pattern 600A of distributed bumps 602 creates the mechanical stop. FIG. 6B shows another example of many possible patterns 600B in which rings 604 are concentrically distributed to create the mechanical stop.

Figure 7:
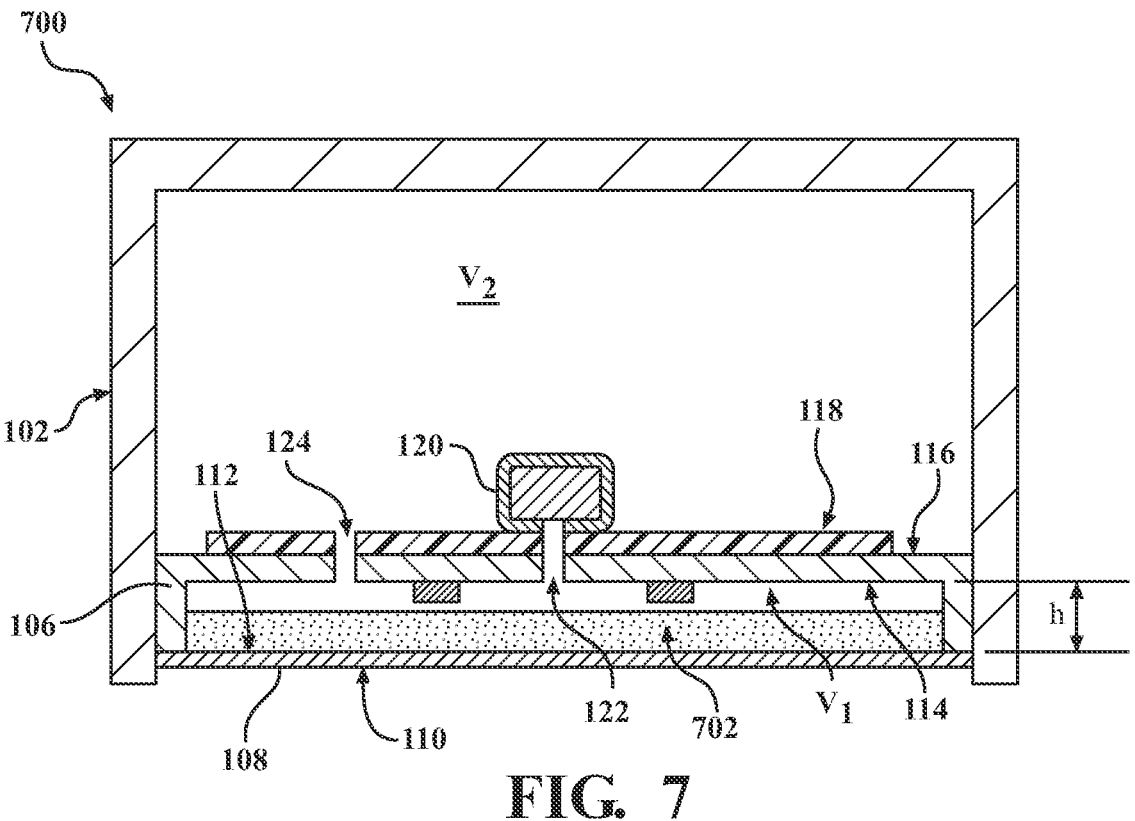
FIG. 7 is a schematic of a sensing device having a damping layer according to one or more embodiments.

In one or more embodiments of the sound and vibration sensing device 700 shown in FIG. 7, a damping layer 702 may be added to the structural membrane 108 to attenuate a resonance peak amplitude of the frequency response curve. The damping layer 702 may be a viscoelastic coating, e.g., rubber, or other suitable material. The damping layer 702 may be added to, or may be an alternative to, the mechanical stop 502.

Figure 8:
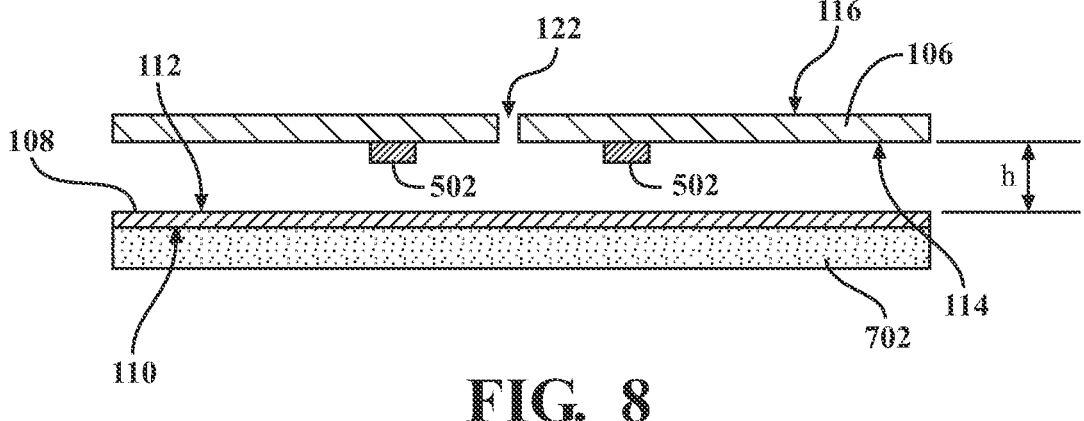
FIG. 8 is a partial view of the sensing device having a damping layer according to one or more embodiments.

The damping layer 702 may be added to the first 110, second 112, or first 110 and second 112, surfaces of the structural membrane 108. The damping layer 702 applied to the second surface 112 of the structural membrane 108 will take up space consuming volume in the closed volume V1, thereby improving the acoustic performance by increasing the sensitivity of the sound and vibration sensing device 700. In one or more embodiments shown in FIG. 8, the damping layer 702 is applied to the first surface 110 of the structural membrane 108. When the damping layer 702 is applied to the first surface 110 of the structural membrane 108, it adds additional protection from environmental contamination that may cause damage to the sensor components.

Figures 9, 10:
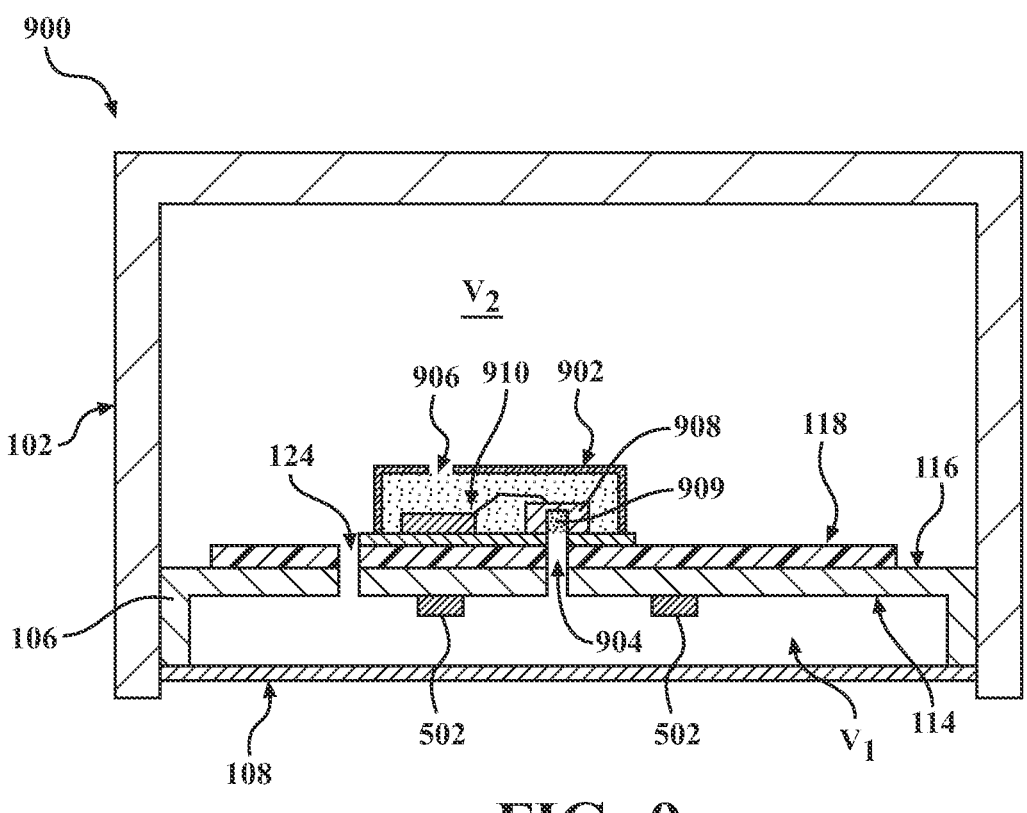
FIG. 9 is a schematic of a sensing device having a micro-electro-mechanical system (MEMS) microphone element according to one or more embodiments.
FIG. 10 is a schematic of a hybrid sensing device having according to one or more embodiments.

A larger second closed air volume, V2, can improve signal to noise ratio (SNR) of the sound and vibration sensing device. FIG. 9 shows one or more embodiments of a sound and vibration sensing device 900 having a bottom port MEMS microphone element 902. The bottom port MEMS microphone element 902 has a MEMS sensing element 908. A first port hole 904 on the bottom of the MEMS sensing element 908 connects an air volume 909 in front of the MEMS microphone element 902 to the closed air volume, V1. A second aperture, or port hole 906, vents an air volume 910 behind the MEMS sensing element 908 to the closed air volume V2. The advantage of this arrangement is that a back volume of the MEMS microphone element 902 is connected to V2 resulting in a much larger effective back volume for the MEMS microphone element 902 which helps reduce microphone self-noise, and therefore, improves the SNR.

In one or more embodiments, shown in FIG. 10, a hybrid waterproof sound and vibration sensing device 1000 is shown. An accelerometer 1002 (e.g., a MEMS accelerometer sensor) is added to the PCB 118. The accelerometer 1002 has an output that is independent of the sound sensing sensor element 120 (MEMS microphone or ECM, for example). The leak channel 124 connects the closed air volume V1 and closed air volume V2 in a manner that configures the sensor element 120 to be insensitive to low frequency vibration and acoustic excitations (see discussion above with reference to FIG. 4). The leak channel 124 has no impact on the accelerometer 1002 as the accelerometer 1002 directly measures the base structure vibration input 111 transmitted to the support structure 106 and the PCB 118 through the housing 102 regardless of the displacement amplitude of the structural membrane 108 or a volume change of the closed air volume, V1. Incorporating the accelerometer 1002 provides simultaneous sound and vibration sensing for vibration input of interest at low frequencies (e.g., ≤50 Hz) and acoustic input of interest at frequencies higher than, for example, 350 Hz.

Figure 11:
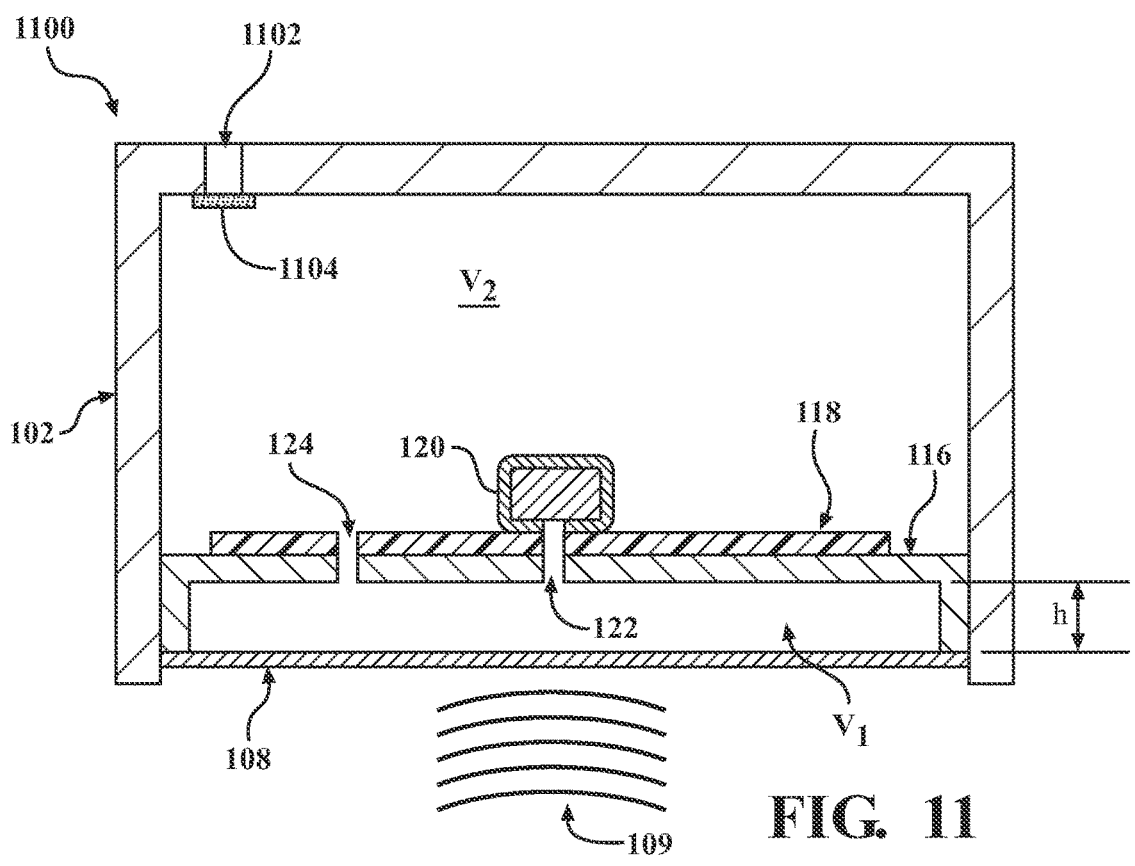
FIG. 11 is a schematic of a sensing device according to one or more embodiments.

In the embodiments described with reference to FIGS. 1-10, the sensor element 120 is entirely sealed from the external environment. While this is ideal for protecting the sensor from the environment, unwanted static pressure may build up inside the first and second closed air volumes, V1, V2. Static pressure build up may occur when there are differences in temperature between the environment and the sealed space inside the first and second closed air volumes. Static pressure may also be caused by changes in altitude. In one or more embodiments, shown in FIG. 11, a waterproof sound and vibration sensor 1100 has a vent, or ventilation hole 1102, in the housing 102. A dense acoustic mesh layer 1104 covers the ventilation hole 1102 from within the housing 102.

The ventilation hole 1102 is sized as small as possible and only large enough as necessary for equalizing the static pressure between the inside of the housing 102 and the external environment. For example, the ventilation hole 1102 may be less than 1 mm in diameter. The ventilation hole 1102 is preferably positioned at a location in the housing 102 as far from the sensor element 120 as possible.

The dense acoustic mesh layer 1104 may be thick enough to protect the interior of the housing 102 from the external environment with a high flow resistance, while still allowing for equalized pressure between the inside and the outside of the housing 102. For example, the dense acoustic mesh layer 1104 may be made of expanded Polytetrafluoroethylene (ePTFE) material on the order of 0.1 to 0.5 mm in thickness.

Figure 12:
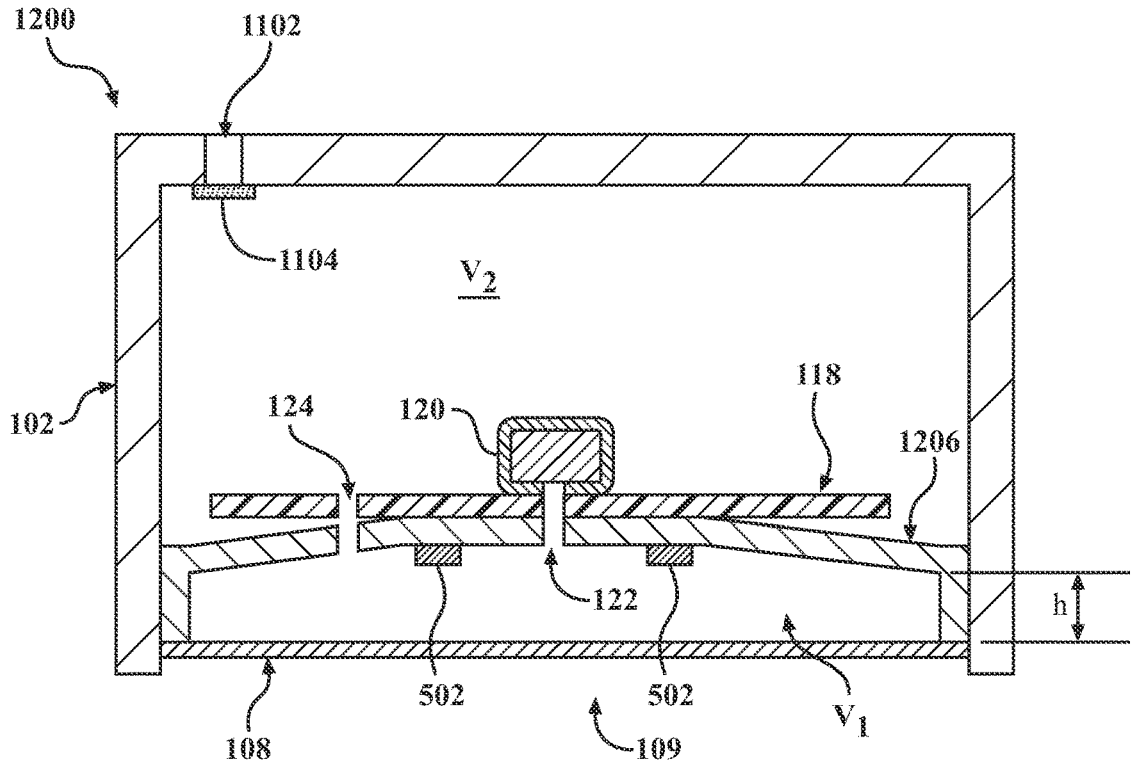
FIG. 12 is a schematic of a sensing device according to one or more embodiments.

It is possible to increase the sensitivity of the sound and vibration sensing device by reducing the first sealed volume, V1. As discussed previously, in one or more embodiments shown in FIG. 12, the sensitivity and the SNR of the sound and vibration sensing device 1200 is improved by reducing the first sealed volume, V1. This may be accomplished by altering the configuration of the supporting structure 1206 in a manner that reduces the size of the first sealed volume, V1. The example shown in FIG. 12 has a configuration for the support structure 1206 that is cone-shaped, which defines a smaller first sealed volume, V1 than the exemplary flat disk-shaped support structure 116 shown in FIG. 11.

Figure 13:
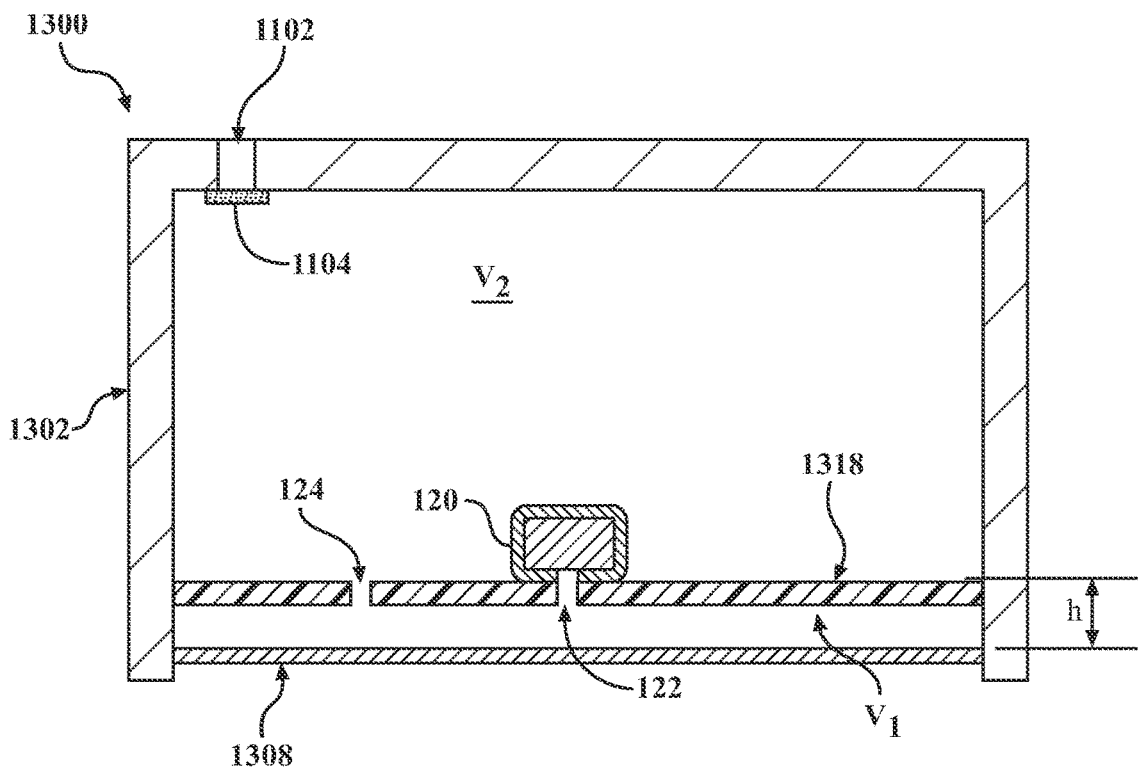
FIG. 13 is a schematic of a sensing device according to one or more embodiments.

Alternatively, in one or more embodiments, as shown in FIG. 13, a separate support structure is not included inside the waterproof sound and vibration sensing device 1300. Instead, the PCB 1318 attaches to the housing 1302 and may be positioned as close as possible to the structural membrane 1308.

Figure 14:
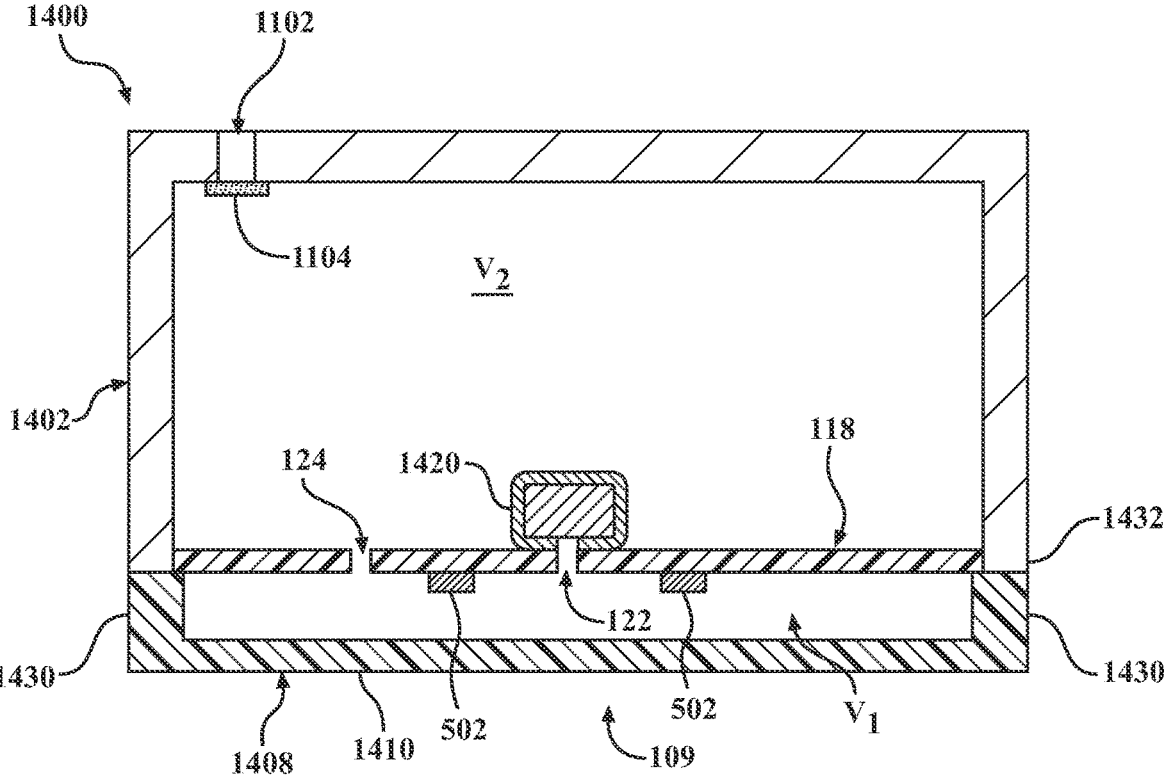
FIG. 14 is a schematic of a sensing device according to one or more embodiments.

Alternatively, or additionally, in one or more embodiments, as shown in FIG. 14, the sound and vibration sensing device 1400 has a structural membrane 1408 that, instead of being recessed in, and attached to, one end of the housing 1402 (as shown in FIGS. 1, 5, 7, and 9-10), the structural membrane 1408 attaches to at one end of the housing 1402 so that it may also function as the support structure. The structural membrane 1408 may be a one-piece configuration with a footing member 1430. The footing member 1430 attaches directly to an outer perimeter 1432 of the housing 1402. The PCB 118 is attached inside the housing 1402 and is supported by the footing member 1430 of the structural membrane 1408. The first surface 1410 of the structural membrane 1408, the surface that is exposed to the external environment, may be a smooth surface to help reduce wind turbulence effect, which is particularly beneficial when the waterproof sound and vibration sensor 1400 is used on a base structure such as a vehicle exterior.

Figure 15:
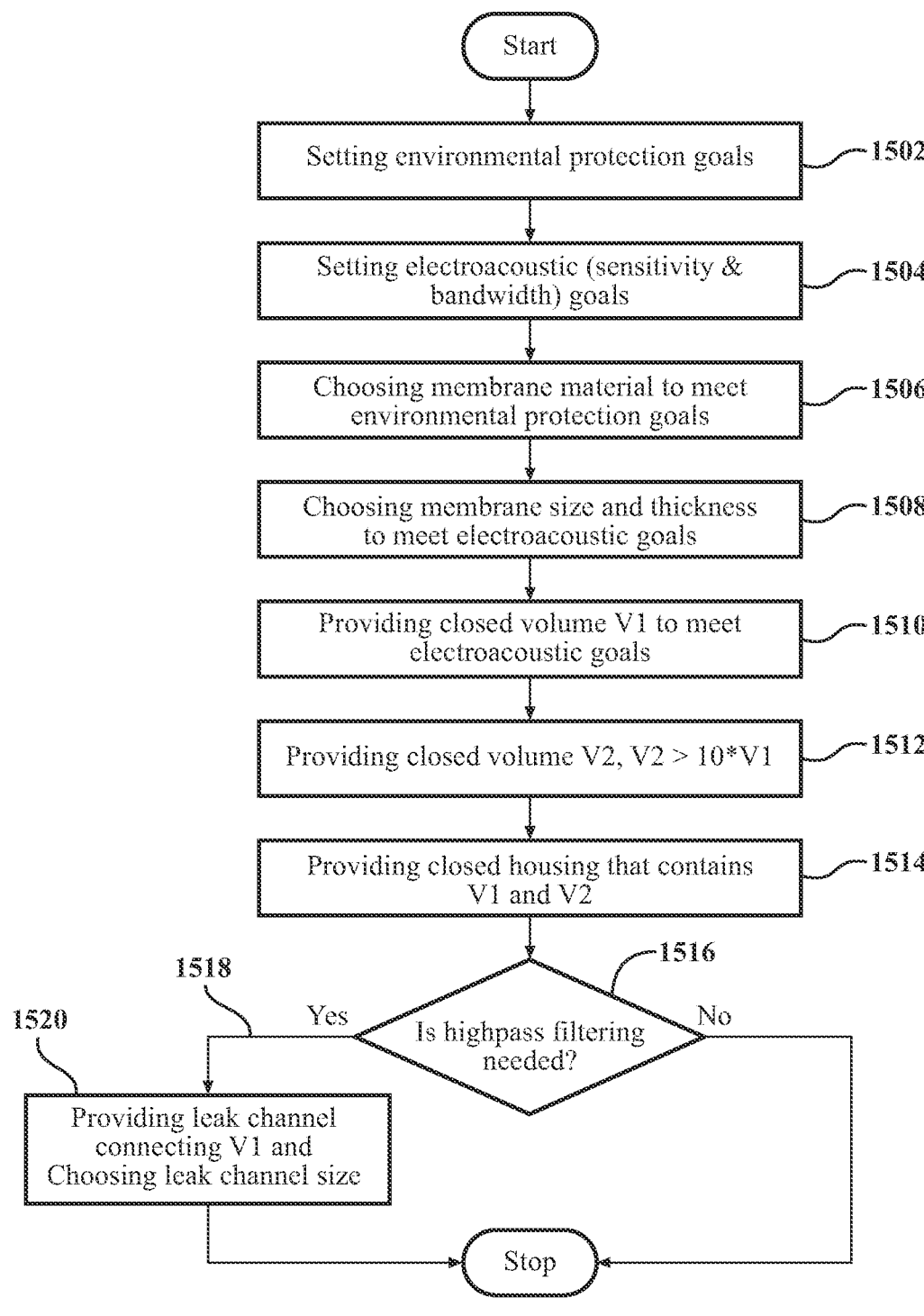
FIG. 15 is a flowchart of a method according to one or more embodiments.

According to one or more embodiments of the inventive subject matter, the sound and vibration sensing device has a closed body that is entirely sealed from the external environment. The structural membrane 108, 1408 is mechanically flexible and vibrates under external sound or vibration excitations. The sensor element 120, which may be a microphone (MEMS, ECM, etc.), an accelerometer, or both, measures the acoustic pressure inside the first closed air volume, V1 by the vibration of the structural membrane 108, 1408. The waterproof sound and vibration sensing device described above has many features that may be used alternatively or additionally making the device configurable for many applications. For example, certain features, such as the membrane material, the membrane size and thickness, as well as the existence of a leak channel or vent, will affect sensitivity, SNR, attenuate the resonance peak, durability, reliability, etc. FIG. 15 shows a method for determining and/or selecting which features should be incorporated into the sensing device based on a set of goals associated with a particular application for the sensing device.

At steps 1502 and 1504, environmental protection and electroacoustic goals are set. At step 1502, consideration should be made about whether the sensing device is going to be mounted on the outside of a vehicle. Whether the sensing device will be subjected to high temperatures, high pressure spray, etc. also needs to be considered. Electroacoustic goals may include sensitivity and bandwidth requirements for the use of the sensing device. For example, detecting an emergency vehicle siren, road noise cancellation, and voice command detection.

At step 1506, a material for the structural membrane is selected based on the environmental goals. The structural membrane may be, for example, in the shape of thin sheets made of engineering plastics, polymers, and metal materials, such as ABS, PBT, Nylon, Aluminum, etc. The structural membrane material should be chosen to first meet the targeted environmental protection requirements, then to provide the best possible sensitivity and bandwidth.

At step 1508 a membrane size (diameter or area) and thickness are selected based on the electroacoustic goals. Assuming a circular shaped structural membrane and housing, an exemplary range of membrane diameters may be between 10 and 35 mm. An exemplary range of membrane thickness may be 0.2 to 0.8 mm for plastic/polymer materials and 0.02 to 0.2 mm for metallic materials.

At step 1510, the first closed volume, V1, is determined based on the electroacoustic goals. The height, h, of the first closed air volume, V1 should be as small as practically allowable to minimize the first enclosed air volume, V1. For example, in the range of 0.1 mm to 1 mm. Also, it should be noted that the first closed air volume, V1, may also be affected by the configuration of the support structure.

At step 1512, the second closed volume, V2, is determined based on the first closed volume, V1. The second closed volume, V2, is preferably larger than the first closed volume, V1. For example, V2 may be on the order of ten times larger than V1.

At step 1514 the size and shape of the closed housing to contain V1 and V2 is determined.

At step 1516, a determination about whether high pass filtering is needed for the specific application of the sound and vibration sensing device. If high pass filtering is needed 1518, a leak channel is incorporated 1520 between V1 and V2. The size of the leak channel is determined based on the electroacoustic goals such as desired sensitivity and bandwidth.

While exemplary embodiments are described above, it is not intended that these embodiments describe all possible forms of the invention. It is understood that various changes may be made without departing from the scope of the invention. Additionally, or alternatively, features of various implementing embodiments may be combined to form further embodiments of the invention. For example, the configuration of the structural membrane may be combined with a housing that is vented to the external environment. The waterproof sound and vibration sensor may incorporate a port hole and a leak channel, or no leak channel. The waterproof sound and vibration sensor may include a leak channel and a vented housing, or no leak channel and a vented housing.

The invention claimed is:

1. A sound and vibration sensing device comprising:
   a housing;
   a support structure in the housing, the support structure having first and second surfaces and an aperture therethrough;
   a structural membrane that is flexible and non-porous, the structural membrane having first and second surfaces, the structural membrane being arranged to seal the housing;
   a first closed air volume defined between the second surface of the structural membrane and the first surface of the support structure;
   a second closed air volume defined between the housing and the second surface of the support structure; and
   a sensor element arranged over an aperture on a printed circuit board assembly (PCBA) attached to the second surface of the support structure, the aperture in the PCBA aligns with the aperture in the support structure and the sensor element measures changes of air pressure in the first closed air volume caused by vibration of the structural membrane induced by external acoustic pressure and structural vibration input; and
   a combined sound and vibration signal output.

2. The device as claimed in claim 1 further comprising a leak channel in the support structure that connects the first closed air volume to the second closed air volume to filter a low frequency vibration signal.

3. The device as claimed in claim 2 wherein a size of the leak channel is dependent upon a predetermined frequency response shape, an attenuation amount, and a predetermined frequency range.

4. The device as claimed in claim 1 further comprising a mechanical stop on the first surface of the support structure.

5. The device as claimed in claim 1, wherein the support structure has a cone-shape.

6. The device as claimed in claim 1 further comprising a damping layer positioned on the structural membrane.

7. The device as claimed in claim 6 wherein the damping layer is positioned on the first surface of the structural membrane.

8. The device as claimed in claim 6 wherein the damping layer is positioned on the second surface of the structural membrane.

9. The device as claimed in claim 1, wherein the housing has a vent from the second closed air volume.

10. The device as claimed in claim 9, further comprising an acoustic mesh layer covering the vent from inside the housing.

11. The device as claimed in claim 1 wherein the sensor element is a MEMS microphone having a first aperture that vents into the first closed air volume and a second aperture that vents into the second closed air volume.

12. The device as claimed in claim 1 further comprising a second sensor element on the printed circuit board assembly for simultaneously sensing sound and vibration.

13. A sound and vibration sensing device comprising:

a housing;

a printed circuit board assembly (PCBA) having an aperture, the PCBA is supported inside the housing;

a sensor element on the PCBA mounted over the aperture;

a structural membrane that is flexible and non-porous, the structural membrane having first and second surfaces, the structural membrane being arranged to seal the housing at one end;

a first closed air volume below the sensor element, the first closed air volume is defined inside the housing under the aperture between the PCBA and the structural membrane; and a second closed air volume above the sensor element, the second closed air volume is defined inside the housing between the housing and the PCBA;

a support structure in the housing, the support structure having first and second surfaces and an aperture therethrough that aligns with the aperture in the PCBA, the first surface of the support structure faces into the first closed air volume and the second surface of the support structure faces into the second closed air volume, the PCBA is supported by the support structure;

wherein the sensor element measures changes in air pressure in the first closed air volume caused by vibration of the structural membrane induced by external acoustic pressure and structural vibration to output a combined sound and vibration signal.

14. The device as claimed in claim 13 further comprising a leak channel in the PCBA that connects the first closed air volume to the second closed air volume to filter a low frequency vibration signal.

15. The device as claimed in claim 14 wherein a size of the leak channel is dependent upon a predetermined frequency response shape, an attenuation amount, and a predetermined frequency range of the sound and vibration sensing device.

16. The device as claimed in claim 13, further comprising a leak channel in the PCBA and the support structure that connects the first closed air volume with the second closed air volume to filter a low frequency vibration signal.

17. The device as claimed in claim 13, further comprising a mechanical stop on the first surface of the support structure.

18. The device as claimed in claim 13, wherein the support structure is cone-shaped.

19. The device as claimed in claim 13, wherein a damping layer is positioned on the first surface of the structural membrane.

20. The device as claimed in claim 13, wherein a damping layer is positioned on the second surface of the structural membrane.

21. The device as claimed in claim 13, wherein the structural membrane further comprises a footing around the second surface, the footing attaches to a bottom surface of the housing to seal the housing and to support the PCBA inside the housing.

22. The device as claimed in claim 13 wherein the sensor element is a MEMS microphone having a first aperture that vents into the first closed air volume and a second aperture that vents into the second closed air volume.

23. The device as claimed in claim 13 further comprising a second sensor element on the PCBA for simultaneously sensing sound and vibration for the combined sound and vibration output signal.

* * * * *